(12) United States Patent
Dahl et al.

(10) Patent No.: US 6,661,701 B2
(45) Date of Patent: Dec. 9, 2003

(54) THREE-TRANSISTOR DRAM CELL AND ASSOCIATED FABRICATION METHOD

(75) Inventors: Claus Dahl, Dresden (DE); Siegmar Köppe, Laatzen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/158,032

(22) Filed: May 30, 2002

(65) Prior Publication Data

US 2003/0016569 A1 Jan. 23, 2003

Related U.S. Application Data

(63) Continuation of application No. PCT/DE00/04221, filed on Nov. 28, 2000.

(30) Foreign Application Priority Data

Nov. 30, 1999 (DE) .......................................... 199 57 543

(51) Int. Cl.[7] .............................................. G11C 11/24
(52) U.S. Cl. ................... 365/149; 365/177; 365/189.01
(58) Field of Search ................................. 365/149, 177, 365/189.01, 72; 257/296; 438/241

(56) References Cited

U.S. PATENT DOCUMENTS

| | | | |
|---|---|---|---|
| 4,626,887 A | * | 12/1986 | Schmitt-Landsiedel et al. .. 257/378 |
| 4,825,417 A | * | 4/1989 | Seo .............................. 365/205 |
| 5,113,235 A | | 5/1992 | Tamakoshi |
| 5,146,300 A | | 9/1992 | Hamamoto et al. |
| 5,812,476 A | * | 9/1998 | Segawa ....................... 365/222 |
| 5,949,705 A | | 9/1999 | Jun et al. |
| 5,998,250 A | * | 12/1999 | Andricacos et al. ........ 438/240 |

FOREIGN PATENT DOCUMENTS

| | | |
|---|---|---|
| EP | 0 463 817 A2 | 1/1992 |
| JP | 54-54588 | 4/1979 |
| JP | 11-17025 | 1/1999 |

\* cited by examiner

*Primary Examiner*—David Lam
(74) *Attorney, Agent, or Firm*—Laurence A. Greenberg; Werner H. Stemer; Gregory L. Mayback

(57) ABSTRACT

The three-transistor DRAM cell has a memory transistor formed as a field-effect transistor with a short-channel section and a long-channel section. A second insulating layer and a conductive layer are additionally formed on a gate layer of the memory transistor. A substantially constant voltage value is present between a potential of the conductive layer and a potential of the substrate area. A three-transistor DRAM cell with improved interference immunity and charge retention time

10 Claims, 2 Drawing Sheets

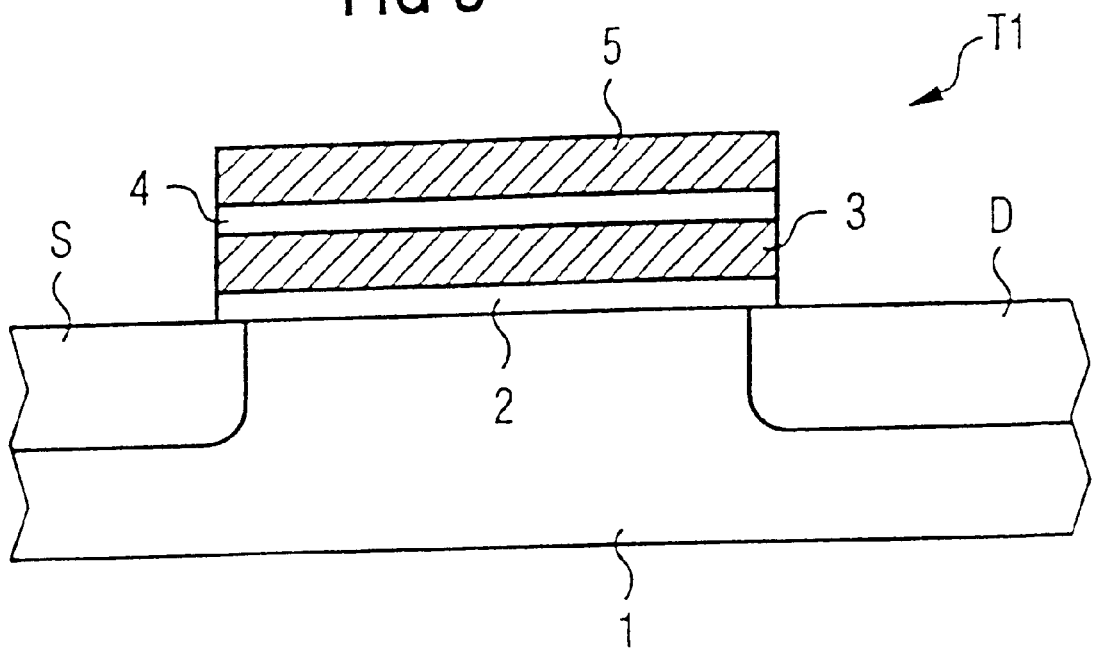
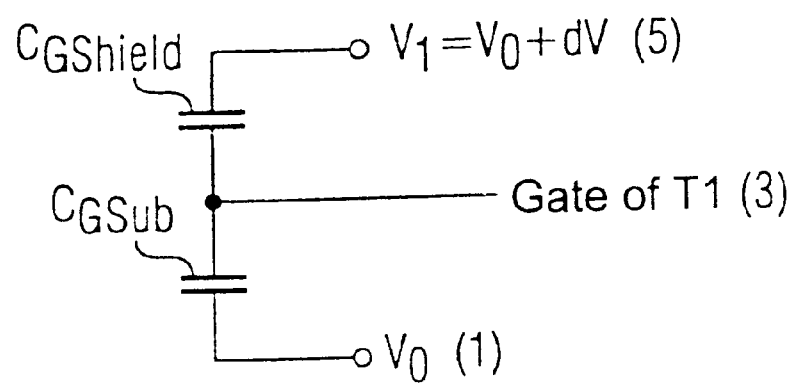

THREE-TRANSISTOR DRAM CELL AND ASSOCIATED FABRICATION METHOD

CROSS-REFERENCE TO RELATED APPLICATION

This application is a continuation of copending International Application No. PCT/DE00/04221, filed Nov. 28, 2000, which designated the United States and which was not published in English.

BACKGROUND OF THE INVENTION

FIELD OF THE INVENTION

The present invention relates to a three-transistor DRAM cell and an associated fabrication method and, in particular, to a three-transistor DRAM cell which has a longer retention time and greater interference immunity in conjunction with a reduced area requirement.

Reference is had to FIG. 1, which shows a simplified illustration of an equivalent circuit diagram for a three-transistor DRAM cell in accordance with the prior art. The cell is used in a multiplicity of dynamic memory devices.

The conventional three-transistor DRAM cell illustrated in FIG. 1 is formed with a memory transistor T1 for the dynamic storage and evaluation of information on its gate capacitance, a write transistor T2 for the writing of information to the memory transistor T1 and a read transistor T3 for the reading of information from the memory transistor T1. For writing information, data, for example, are applied to a bit write line BW (bit write) and are switched through via an address write line AW (address write) via the write transistor T2 to the memory transistor T1. More precisely, in this case the charges present on the bit write line BW are charged via the activated write transistor T2 onto the gate capacitance of the memory transistor T1, these stored charges altering the switching behavior of the memory transistor T1. In order to read out the information stored on the gate capacitance of the memory transistor T1, in accordance with FIG. 1, the read transistor T3 is driven via an address read line AR (address read) and the switching state of the memory transistor T1 is output to the bit read line BR (bit read) according to its charges stored on the gate capacitance.

On account of the limited retention time for the charges on the gate capacitance of the memory transistor T1, such a memory cell must be refreshed at regular intervals. This is why the cell is referred to as a dynamic RAM cell (RAM, random access memory).

In order to reduce an area requirement of such three-transistor DRAM cells, the Japanese patent document JP 11017025 discloses a polygonal patterning of a gate of the memory transistor T1.

With reference to FIG. 2, there is shown a simplified illustration of the layout of the memory transistor T1 of such a three-transistor DRAM cell with a reduced area requirement. In this case, an active area AA for realizing a drain region D and a source region S is formed in a semiconductor substrate. At a spacing distance, spaced by an insulating layer, there is situated above the active area AA a polysilicon layer 3 for forming a polygonal gate G in the overlapping regions with the active area AA. In that case, the form of the polysilicon layer 3 or of the gate G is defined in such a way that both a short-channel section A and a long-channel section are formed between the source region S and the drain region D. A three-transistor DRAM cell with a reduced space requirement and an improved storage capacity or dynamic retention time is obtained in this way.

It is disadvantageous that such a DRAM cell has a low degree of interference immunity on account of the enlarged gate area.

SUMMARY OF THE INVENTION

It is accordingly an object of the invention to provide a three-transistor DRAM cell and an associated fabrication process, which overcomes the above-mentioned disadvantages of the heretofore-known devices and methods of this general type and which provides for a cell that has an improved interference immunity and charge retention capability in conjunction with a minimal space requirement.

With the foregoing and other objects in view there is provided, in accordance with the invention, a three-transistor DRAM cell, comprising:

a memory transistor for dynamically storing information, a write transistor connected for writing information to the memory transistor, and a read transistor connected for reading information from the memory transistor;

the memory transistor being a field-effect transistor having a substrate area, a first insulating layer above the substrate area, a gate layer above the insulating layer formed with a short-channel section and a long-channel section, a second insulating layer and a conductive layer formed directly on the gate layer; and wherein a substantially constant voltage value is present between a potential of the conductive layer and a potential of the substrate area.

A DRAM cell with an increased capacitance and hence charge retention time is obtained in particular by virtue of the formation of a second insulating layer and a conductive layer on the gate layer of the memory transistor, essentially a constant voltage value being present between a potential of the conductive layer and a potential of a substrate area. The charges stored on the gate capacitances of the respective memory transistors can therefore be refreshed at longer time intervals. Furthermore, the formation of the conductive layer directly above the charge-storing gate layer forms a shielding layer which reliably shields interference pulses from overlying metalization lines and/or RF radiation, as a result of which the charge retention times of the memory transistor are in turn improved.

In accordance with an added feature of the invention, the constant voltage value is zero or it corresponds to an operating voltage.

In accordance with an additional feature of the invention, the conductive layer has a patterning substantially identical to a patterning of the gate layer.

In accordance with another feature of the invention, the conductive layer is a polysilicon layer or a metallic layer.

In accordance with a further feature of the invention, the second insulating layer is a dielectric with a high relative permittivity $\in_r$.

In accordance with again an added feature of the invention, the second insulating layer has a thickness substantially identical to a thickness of the first insulating layer.

In accordance with again an additional feature of the invention, the substrate area is a well formed in a substrate.

In accordance with again a further feature of the invention, the gate layer and the conductive layer are patterned with an L-shape, a Z-shape, an E-shape, a triangular shape, and/or an annular shape.

With the above and other objects in view there is also provided, in accordance with the invention, a method of fabricating a three-transistor DRAM cell having a memory transistor, a write transistor for writing information to the memory transistor; and a read transistor for reading information from the memory transistor. The method comprises the following steps:
a) providing an active area for the memory transistor in a substrate area;
b) forming a first insulating layer on a surface of the substrate area;
c) forming a gate layer on a surface of the first insulating layer;
d) patterning the gate layer;
e) forming source and drain regions in the substrate area;
f) cleaning a surface of the gate layer (e.g. in a HF dip cleaning step);
g) forming a second insulating layer directly on the surface of the gate layer of the memory transistor;
h) forming a conductive layer on the surface of the second insulating layer; and
i) patterning the conductive layer.

In accordance with again a further feature of the invention, the conductive layer on the surface of the second insulating layer is formed by depositing a polysilicon layer and carrying out an ion implantation.

In accordance with a concomitant feature of the invention, step h) further comprises forming an additional silicide layer.

Other features which are considered as characteristic for the invention are set forth in the appended claims.

Although the invention is illustrated and described herein as embodied in a three-transistor DRAM cell and associated fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic sectional view of a memory transistor according to the present invention; and FIG. 4 is a simplified schematic of an equivalent circuit diagram of the memory transistor according to the present invention.

DESCRIPTION OF THE PREFERRED EMBODIMENTS

Figure 1:
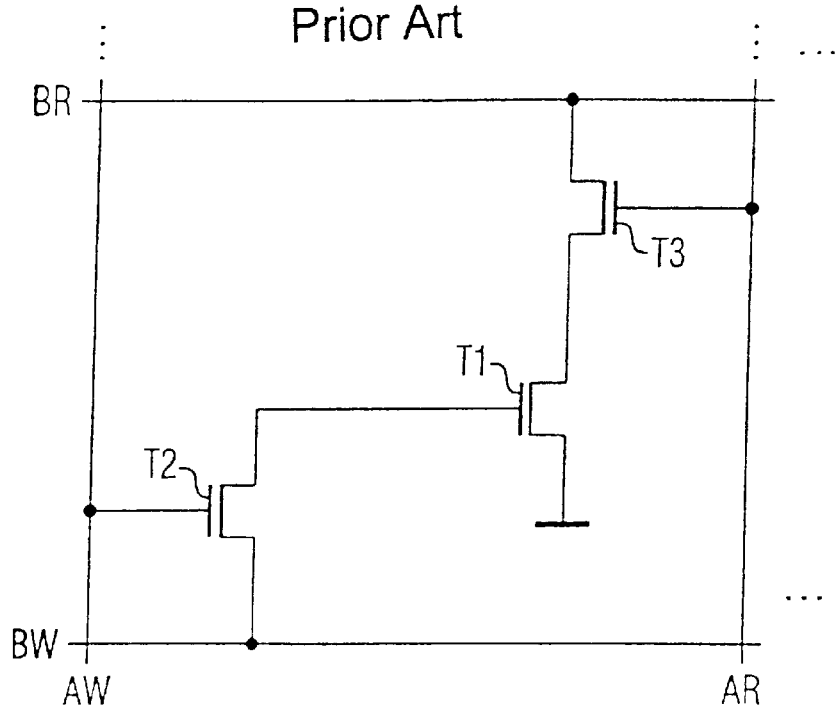
FIG. 1 is a simplified illustration of an equivalent circuit diagram of a three-transistor DRAM cell in accordance with the prior art.

Referring now to the figures of the drawing in detail and first, particularly, to FIG. 3 thereof, there is shown a diagrammatic sectional view of a memory transistor T1 in the three-transistor DRAM cell according to the invention. A source region S and a drain region D are formed at the surface in an active area in a semiconductor substrate or a substrate area 1. The substrate area 1 may constitute, for example, a doped well region or directly the semiconductor substrate (e.g. silicon). In order to form a field-effect transistor, a first insulating layer 2 with overlying gate layer 3 is situated above a channel region formed between source region S and drain region D. The first insulating layer 2 is preferably composed of $SiO_2$, but other materials and/or further gate insulating layers can also be used. The gate layer 3 forming a gate G is preferably composed of polysilicon which is highly doped. Other conductive layers can also be used as the gate layer 3.

The inventive concept is evident in the second insulating layer 4 and an additional conductive layer 5, which are formed directly above the gate layer 3. They improve, on the one hand, the interference immunity of the three-transistor DRAM cell and also the charge retention time in the memory transistor T1. More precisely, a charge-retaining capacitance, essentially formed from a capacitance $C_{GSub}$ between the gate layer 3 and the underlying substrate area 1, is considerably enlarged by the further capacitance $C_{Gshield}$ comprising the gate layer 3, the second insulating layer 4, and the conductive layer 5.

FIG. 4 shows a simplified illustration of an equivalent circuit diagram for the memory transistor T1. Accordingly, the (parasitic) gate capacitance $C_{Gsub}$ is formed between the gate terminal or the gate layer 3 and the substrate or substrate area 1. However, the second insulating layer 4 formed directly above the gate layer 3 and the conductive layer 5 furthermore form the additional shielding capacitance $C_{Gshield}$, whereby the charge retention properties in the memory transistor T1 are significantly improved. In accordance with FIG. 4, by way of example, the conductive layer 5 is put at a potential $V_1$ and the substrate area 1 at a potential $V_0$. Both potentials are essentially constant with respect to one another during operation. The following holds true:

$$V_1 - V_0 = dV (=\text{constant}).$$

In a realization of a DRAM cell array using n-channel MOSFETs, preferably stable voltages such as Vss or ground or the output voltage of a non-illustrated substrate generator $V_{sub}$ will be used for $V_0$. Furthermore, a voltage supply $V_{DD}$ or any other essentially constant voltage can be used for the potential $V_1$. Analogous allocations apply here to complementary and/or mixed implementations of the three-transistor DRAM cell. However, a realization that is very favorable with regard to the area requirement is preferably obtained for $V_1 = V_0 = $ Vss or $V_{DD}$, i.e. $dV \approx 0V$.

Figure 2:
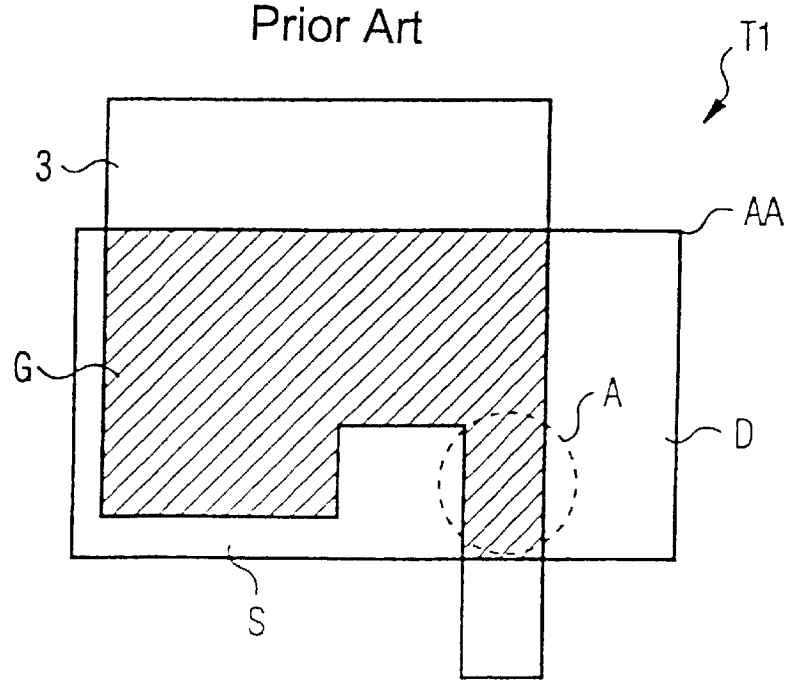
FIG. 2 is a simplified illustration of a layout of a memory transistor in accordance with the prior art.

A patterning of, in particular, the conductive layer 5 in this case essentially corresponds to a patterning of the underlying gate layer 3, which is why, in particular when using the polygonal gate layer structure shown in FIG. 2, an extraordinary optimization results for the area requirement of the three-transistor DRAM cell in conjunction with improved charge retention properties. In this case, the transistor properties of the memory transistor T1 are essentially determined by the short-channel section A (switching transistor), while the charge retention properties result from the specific patterning of the gate G or the gate layer 3 in conjunction with the overlying conductive layer 5.

A dielectric that provides good insulation is preferably used for the second insulating layer 4, as may be realized for example by $SiO_2$ or $Si_3N_4$. However, the dielectric for the second insulating layer 4 may also comprise SiOxNy or a multilayer dielectric. By way of example, an ONO layer sequence (oxide/nitride/oxide) may be used as such a multilayer dielectric. A particular increase in capacitance is obtained when using so-called high $\in$ dielectrics, which have an extremely high relative permittivity $\in_r$. Such dielectrics are $TiO_x$ or $WO_x$, for example.

In the dimensioning of the insulating layer 4, a layer thickness identical to that for the first insulating layer 2 is preferably used, whereby a gate capacitance is doubled, for example, with the same materials. In this way, the charge retention properties can be defined relatively simply.

However, an essential advantage of the present invention resides in the fact that the conductive layer 5 not only improves the charge retention properties of the memory transistor T1 as it were as additional discrete capacitance, but furthermore acts as shielding layer with respect to instances of RF irradiation and/or interference pulses. More precisely, there are usually situated above the layer sequence illustrated in FIG. 3, for example, further metalization planes for the realization of the respective address and bit lines (e.g. AW, AR, BW, BR). The signals transmitted on such metalization planes often generate interference pulses in the memory transistor T1, which pulses can lead to a significant impairment of the charges held on the gate capacitance. The consequence is a memory transistor T1 reprogrammed by interference signals and/or a shortened charge retention time. An RF radiation present externally acts on the switching behavior of the memory transistor T1 in the same way, as a result of which the charge retention time is altered or the transistor is even reprogrammed.

However, on account of the conductive layer 5 illustrated in FIG. 3, such an interference radiation which is (usually) introduced from the top side of the semiconductor substrate 1 is effectively absorbed or neutralized, for which reason not only is the retention time increased but there is also an improvement in the interference immunity with respect to interference pulses or RF radiation.

In addition to the conventional form illustrated in FIG. 2, the patterning of the gate layer 3 and of the associated conductive layer 5 may be formed in an L-shaped, Z-shaped or E-shaped manner, for example, in a plan view, the structure of the gate layer 3 and of the conductive layer 5 essentially always being composed of at least one short-channel section A and at least one long-channel section. However, triangular or annular structures are also conceivable for the gate layer 3 and the associated conductive layer 5, whereby it is possible to realize further optimizations with regard to the area requirement of the three-transistor DRAM cell.

A method for fabricating the three-transistor DRAM cell described above is described below. Firstly, in a standard CMOS process (for example INFINEON C6NA), active areas AA (active area) are formed in a semiconductor substrate. For insulation, in this case LOCOS methods or STI methods are possible, for example. Afterward, corresponding well areas and channel regions are formed in the active areas AA by means of diffusion and/or ion implantation, wherein case, by way of example, the first insulating layer 2 and the gate layer 3 can be used as masks. In the same way, LDD (low doped drain) and HDD (high doped drain) implantations can be used for the subsequent formation of the source regions S and the drain regions D. At this point in time, the gate layer 3 is already brought to the special form with its short-channel and long-channel sections.

Afterward, the surface of the gate layer 3 is freed of contamination by means of HF dip cleaning and, for example, a dielectric having a high relative permittivity $\in_r$ is deposited. However, it is also possible to deposit conventional dielectrics such as e.g. $SiO_2$ and/or $Si_3N_4$ by means of an LPCVD method (low pressure chemical vapor deposition). The formation of the dielectric serving as second insulating layer 4 is preferably followed by a deposition of polysilicon with subsequent ion implantation, as a result of which a highly doped polysilicon layer is obtained as conductive layer 5. Finally, the highly doped polysilicon layer is patterned by means of photolithography and dry etching, the dielectric of the second insulating layer 4 being used as an etching stop layer. The subsequent steps for passivation and metalization of the respective transistors and memory cells are effected in a CMOS standard method—not described in any greater detail below—with intermediate oxide deposition and subsequent metalization.

During the deposition of the conductive layer 5, it is possible, for example, to form a polysilicon layer with silicide layer, whereby the interference immunity is improved further on account of the higher conductivity of the silicide.

The invention has been described above with reference to n-channel transistors. However, it is not restricted thereto but rather also encompasses p-channel transistors, a combination of p- and n-channel transistors and all other types of field-effect transistor.

A polysilicon layer is preferably used for the gate layer 3 and the conductive layer 5. However, the invention is not restricted thereto but rather encompasses all other conductive layers and, in particular, metallic layers for the conductive layer 5 and the gate layer 3.

We claim:

1. A three-transistor DRAM cell, comprising:
   a memory transistor for dynamically storing information;
   a write transistor connected for writing information to said memory transistor; and
   a read transistor connected for reading information from said memory transistor;
   said memory transistor being a field-effect transistor having a substrate area, a first insulating layer above said substrate area, a gate layer above said insulating layer formed with a short-channel section and a long-channel section, a second insulating layer and a conductive layer; and
   said second insulating layer formed directly on said gate layer; and
   said conductive layer formed on said second insulating layer;
   said conductive layer connected to a potential and said substrate area connected to a potential such that a potential difference between the potential on said conductive layer and the potential on said substrate area is substantially constant.

2. The three-transistor DRAM cell according to claim 1, wherein the constant voltage value is zero.

3. The three-transistor DRAM cell according to claim 1, wherein the constant voltage value corresponds to an operating voltage.

4. The three-transistor DRAM cell according to claim 1, wherein said conductive layer has a patterning substantially identical to a patterning of said gate layer.

5. The three-transistor DRAM cell according to claim 1, wherein said conductive layer is a polysilicon layer.

6. The three-transistor DRAM cell according to claim 1, wherein said conductive layer is a metallic layer.

7. The three-transistor DRAM cell according to claim 1, wherein said second insulating layer has a dielectric with a high relative permittivity $\in_r$.

8. The three-transistor DRAM cell according to claim 1, wherein said second insulating layer has a thickness substantially identical to a thickness of said first insulating layer.

9. The three-transistor DRAM cell according to claim 1, wherein said substrate area is a well formed in a substrate.

10. The three-transistor DRAM cell according to claim 1, wherein said gate layer and said conductive layer are patterned with a shape selected from the group consisting of an L-shape, a Z-shape, an E-shape, a triangular shape, and an annular shape.

* * * * *